United States Patent [19]
Norman et al.

[11] Patent Number: 5,956,289
[45] Date of Patent: Sep. 21, 1999

[54] CLOCK SIGNAL FROM AN ADJUSTABLE OSCILLATOR FOR AN INTEGRATED CIRCUIT

[75] Inventors: Robert D. Norman, San Jose; Christophe J. Chevallier, Palo Alto, both of Calif.

[73] Assignee: Micron Technology, Inc., Boise, Id.

[21] Appl. No.: 08/877,253

[22] Filed: Jun. 17, 1997

[51] Int. Cl.⁶ .................................................. G11C 7/00
[52] U.S. Cl. ..................... 365/233; 365/211; 365/212; 365/185.23; 365/185.27
[58] Field of Search ................. 365/185.33, 185.18, 365/185.23, 185.27, 211, 212, 222, 233, 189.09; 327/149, 153, 158, 160, 161

[56] References Cited

U.S. PATENT DOCUMENTS

| | | | |
|---|---|---|---|
| 4,716,551 | 12/1987 | Inagaki | 365/222 |
| 5,126,590 | 6/1992 | Chern | 307/296.2 |
| 5,268,871 | 12/1993 | Dhong et al. | 365/226 |
| 5,276,843 | 1/1994 | Tillinghast et al. | 365/222 |
| 5,278,796 | 1/1994 | Tillinghast et al. | 365/211 |
| 5,301,161 | 4/1994 | Landgraf et al. | 365/229 |
| 5,352,945 | 10/1994 | Casper et al. | 307/603 |
| 5,363,335 | 11/1994 | Jungroth et al. | 365/226 |
| 5,373,227 | 12/1994 | Keeth | 323/313 |
| 5,392,251 | 2/1995 | Manning | 365/222 |
| 5,418,747 | 5/1995 | Tobita | 365/194 |
| 5,440,520 | 8/1995 | Schutz et al. | 365/226 |
| 5,446,696 | 8/1995 | Ware et al. | 365/222 |
| 5,451,892 | 9/1995 | Bailey | 327/113 |
| 5,581,206 | 12/1996 | Chevallier et al. | 327/143 |
| 5,594,360 | 1/1997 | Wojciechowski | 324/771 |
| 5,596,534 | 1/1997 | Manning | 365/189.09 |
| 5,610,869 | 3/1997 | Yoo et al. | 365/222 |
| 5,615,151 | 3/1997 | Furuno et al. | 365/185.18 |
| 5,680,359 | 10/1997 | Jeong | 365/211 |
| 5,784,328 | 7/1998 | Irrinki et al. | 365/222 |

OTHER PUBLICATIONS

"Compact Flash 4—15 MB", *1997 Flash Memory Data Book*, Micron Quantum Devices Inc. Boise, Idaho, 3–1 to 3–3, (1997).

"Flash Memory 2MEG x 8", *1997 Flash Memory Data Book*, Micron Quantum Devices Inc. Boise, Idaho, 2–5 to 2–33, (1997).

*Primary Examiner*—Vu A. Le
*Attorney, Agent, or Firm*—Schwegman, Lundberg Woessner & Kluth P.A.

[57] ABSTRACT

An integrated circuit is described which has circuitry to detect environmental conditions such as temperature and supply voltage and adjust the operation of the circuit accordingly. A flash memory system is described which includes a temperature detector and a supply voltage detector. The memory monitors temperature and voltage and adjusts an oscillator circuit to maintain an ideal operating frequency. The oscillator includes adjustable delay stages which can be selectively fed back to adjust operating frequency. To save power, unused delay stages of the oscillator can be disabled. Oscillator calibration circuitry, a temperature detector, and a voltage detector are described.

59 Claims, 10 Drawing Sheets

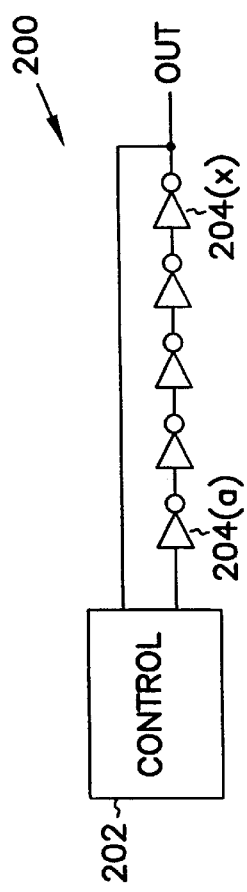
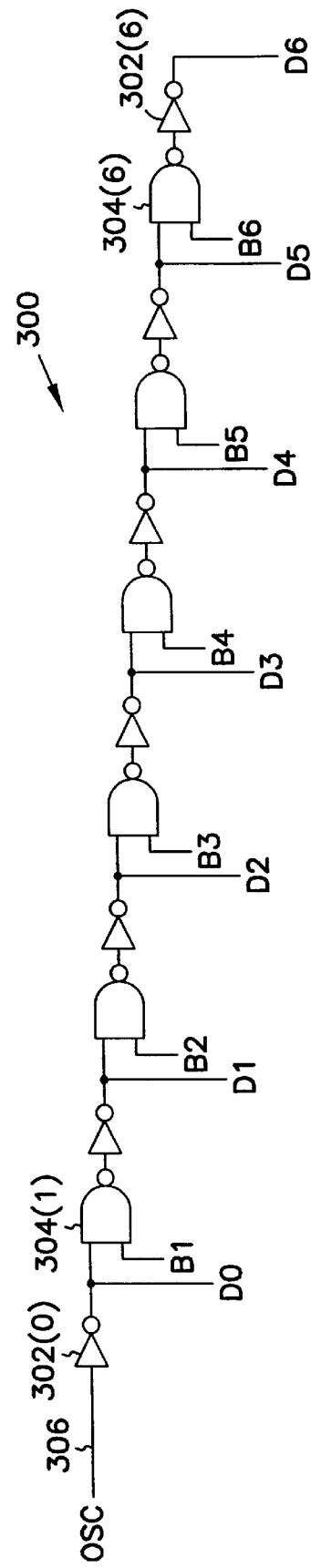
FIG. 2 (PRIOR ART)
FIG. 3

CLOCK SIGNAL FROM AN ADJUSTABLE OSCILLATOR FOR AN INTEGRATED CIRCUIT

TECHNICAL FIELD OF THE INVENTION

The present invention relates generally to integrated circuits and in particular the present invention relates to dynamically controlling the operation of an integrated circuit.

BACKGROUND OF THE INVENTION

Almost all electronic systems rely on a clock source and clock signal to act as a master timing element for control of hardware included in the system. Several different methods of generating a clock signal are known to those skilled in the art. Three commonly used oscillators described below are based on either a crystal, a resistor-capacitor network, or a ring oscillator. None of these options provide a low cost, high accuracy clock signal.

Traditional methods of generating the clock signal have used crystals. While this method is well known and is very reliable, several problems are introduced when the electronic system package is reduced in size. Additional problems are encountered when reducing the cost and power consumption of the system become dominant considerations.

The frequency of a crystal operating point is determined by the physical characteristics of the crystalline structure. This physical dependance dictates the size of the package, preventing its use in some applications required to fit into very small packages, such as small memory cards. Further, crystal oscillators require valuable circuit board space and have minimum height restrictions. A system incorporating a crystal, therefore, is limited in the ability to reduce packaging sizes. A crystal-based system also requires extra pins for connecting the crystal to an integrated circuit requiring the clock signal. In addition, a typical crystal design requires a resistor and capacitor, adding cost, but more importantly taking more board space.

Crystal oscillator designs have additional disadvantages. The crystal oscillators do not operate over extended voltage ranges. Therefore, a supply voltage which ranges from three to five volts can create problems. Crystals also have long start times when power to the system is turned on. These start times must be taken into account so that glitches and low voltage signals do not make the system malfunction. During a start-up, the oscillator can be disconnected from the system until the crystal has reached a stabile operating point. The time required to stabilize the crystal can be quite long and will reduce the performance of systems that require extensive use of power on/off. One type of system affected is portable battery-driven circuits which turn off the power supply to conserve the battery. In addition to the power and performance problems described, crystals are somewhat expensive and further add to the cost of systems.

Crystal-based systems can be quite power demanding. If a crystal oscillator is used, it requires significant current for its operation, typically 1 mA per 1 megahertz of operation. For example, if a crystal is used across an inverter in an integrated circuit, the inverter must be of sufficient strength to allow oscillation and drive the loads required. This typically requires large current for proper operation. Because of the slow start-up time, the systems tend to leave power applied to the crystal. Again, continuously powering the crystal results in high power consumption, making the systems less attractive in battery applications.

One solution that designers have devised to reduce the slow start up time of crystals is to use of resistor-capacitor (RC) oscillator designs. RC oscillators do not have the frequency accuracy of crystal oscillator, but have other operational advantages. The use of an RC oscillator essentially allows instant start-up of the clock signal from a stopped state. This design option also has problems that make for a less than ideal solution. While this approach solves the delay time for starting or stopping the clock, it still requires external resistor and capacitor components which add to the package space requirements. An RC oscillator also requires additional pins for the circuit, typically 2 output and 1 input pin. Driver circuits used to output the RC clock signals tend to be larger than what would be used to drive internal signals. Thus, the RC oscillator circuit requires more power than an internally generated clock or driver signal. Further, variations between the components in the RC network also introduce variations in the clock frequency. Ways of reducing these variations are possible, but can be costly.

Ring oscillators have been used as an easy way to make an oscillating signal, and have been incorporated in many electronic circuits. The ring oscillator is commonly used in integrated circuit designs where an exact clock signal is not required. In systems, such as Flash memory systems, a ring oscillator can be used that would allow the system to function. Large performance variations, however, would be seen by the system as the ring oscillator varied over process differences, voltage variations and temperature excursions. In most cases the resultant wide range of operating parameter frequencies would be intolerable and would make for a noncompetitive product.

Systems which do not require the accuracy of a crystal oscillator can be operated using either a RC oscillator or a ring oscillator. A Flash memory system is an example of a system where some variation in timing can be tolerated, if lower cost and power savings can be realized. The ring oscillator is the most attractive because it requires less power, less pins and has fast start-stop gating. The huge drawback of this approach is the wide variations in clock signal frequency over operating parameter variables such as voltage and temperature that typically would be seen by such a system.

For the reasons stated above, and for other reasons stated below which will become apparent to those skilled in the art upon reading and understanding the present specification, there is a need in the art for an integrated circuit which optimizes operating performance by dynamically monitoring environmental parameters and adjusting the operation and clock signal frequency.

SUMMARY OF THE INVENTION

The above mentioned problems with clock signal variations and other problems are addressed by the present invention and which will be understood by reading and studying the following specification. An integrated circuit is described which adjusted to compensate for oscillator variations.

In particular, the present invention describes an integrated circuit comprising an adjustable oscillator circuit for producing a clock signal, and control circuitry for adjusting a frequency of the clock signal in response to a measured dynamic parameter of the integrated circuit. In another embodiment, a flash memory device is described which comprises an adjustable oscillator circuit for producing a clock signal, internal circuitry for measuring a dynamic parameter of the memory device, and control circuitry for adjusting a frequency of the clock signal in response to a measured dynamic parameter. In both embodiments, the dynamic parameter can be either, or both a temperature of the integrated circuit, or a supply voltage level of the integrated circuit.

In yet another embodiment, a method is described for operating a memory circuit having an adjustable oscillator circuit for providing a clock signal. The method comprises the steps of calibrating the adjustable oscillator circuit to provide a clock signal having a predetermined frequency, detecting a dynamic parameter of the memory circuit, and adjusting the adjustable oscillator in response to the detected dynamic parameter to change the frequency of the clock signal.

A method is described for operating a memory device comprising a clock circuit for providing a clock signal having a frequency, the memory device being designed to operate over an environmental parameter having lower, nominal, and upper levels. The method comprising the steps of adjusting the clock circuit so that the frequency of the clock signal is at a predetermined level when the environmental parameter is at the nominal level, detecting a level of the environmental parameter, and adjusting the frequency of the clock signal based upon the detected level of the environmental parameter. The method also includes the steps of monitoring the operation of the memory device to detect operating errors, resetting the clock circuit to the predetermined level if errors are detected, detecting a new level of the environmental parameter after the clock circuit has been reset, and adjusting the frequency of the clock signal based upon the detected new level of the environmental parameter.

BRIEF DESCRIPTION OF THE DRAWINGS

FIG. 2 is a schematic diagram of a prior art ring oscillator;

FIG. 3 is a schematic diagram of an adjustable ring oscillator;

DETAILED DESCRIPTION OF THE INVENTION

In the following detailed description of the preferred embodiments, reference is made to the accompanying drawings which form a part hereof, and in which is shown by way of illustration specific preferred embodiments in which the inventions may be practiced. These embodiments are described in sufficient detail to enable those skilled in the art to practice the invention, and it is to be understood that other embodiments may be utilized and that logical, mechanical and electrical changes may be made without departing from the spirit and scope of the present inventions. The following detailed description is, therefore, not to be taken in a limiting sense, and the scope of the present inventions is defined only by the appended claims.

The present invention addresses major causes of frequency variation in a ring oscillator design; process, voltage, and temperature variations. The first problem, process variation, can be reduced by allowing for skew adjustment calibration during manufacturing. This adjustment eliminates the majority of timing variations in the oscillator do to the process differences. The adjustments greatly narrow the frequency range and allow for a much tighter range of operation. The ring oscillator, therefore, can be made a practical solution for electronic systems, such as a Flash memory controller. The invention also allows for dynamic adjustments for temperature and voltage variations. These adjustments are accomplished by sensing the voltage and temperature values and dynamically making adjustments in clock frequency.

Flash Memory

Figure 1A:
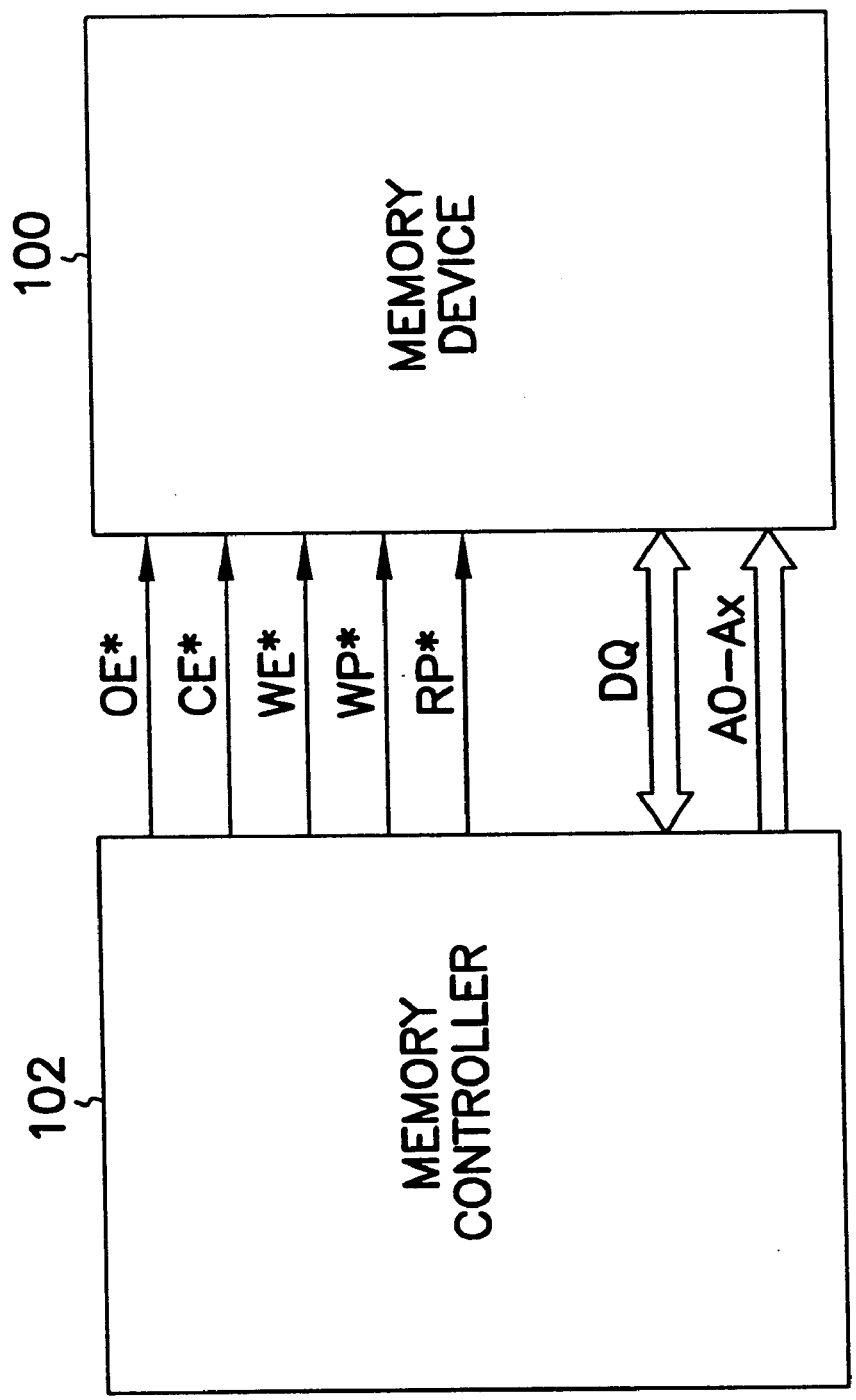
FIG. 1A is a block diagram of a flash memory system
Figure 1B:
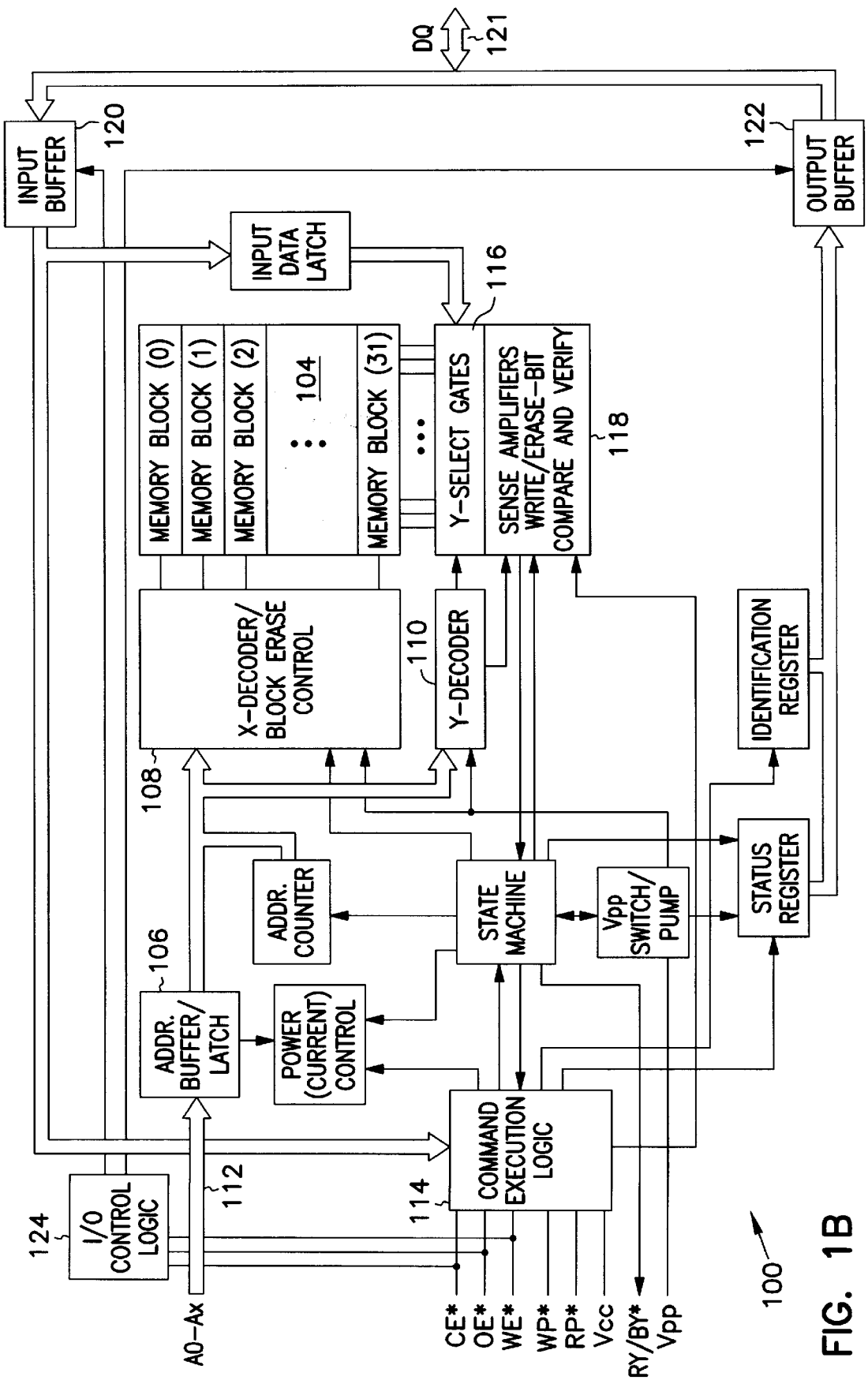
FIG. 1B is a detailed diagram of the flash memory of FIG. 1A.

FIG. 1A illustrates a block diagram of a basic Flash memory device 100 which is coupled to a flash controller 102. The memory device has been simplified to focus on features of the memory which are helpful in understanding the present invention. The memory device 100 includes an array of memory cells 104, FIG. 1B. The memory cells are preferably floating gate memory cells. The array is arranged in rows and columns, with the rows arranged in blocks. The blocks allow memory cells to be erased in large groups. Data, however, is stored in the memory array individually or in small data groups (byte or group of bytes) and separate from the block structure. Erase operations are performed on a large number of cells in parallel.

An x-decoder 108 and a y-decoder 110 are provided to decode address signals provided on address lines A0–Ax 112. Address signals are received and decoded to access the memory array 104. An address buffer circuit 106 is provided to latch the address signals. A y-select circuit 116 is provided to select a column of the array identified with the y-decoder 110. Sense amplifier and compare circuitry 118 is used to sense data stored in the memory cells and verify the accuracy of stored data. Data input 120 and output 122 buffer circuits arc included for bi-directional data communication over a plurality of data (DQ) lines with the microprocessor 102. Command control circuit 114 decodes signals provided on control lines from the microprocessor. These signals are used to control the operations of the memory, including data read, data write, and erase operations. Input/output control circuit 124 is used to control the input and output buffers in response to some of the control signals. As stated above, the Flash memory of FIG. 1A has been simplified to facilitate a basic understanding of the features of the memory. A more detailed understanding of Flash memories is known to those skilled in the art. See "1997 Flash Memory Data Book" pages 2-5 to 2-33 available from Micron Quantum Devices, Inc. (incorporated herein by reference) for a more detailed description of a Flash memory.

Figure 1C:
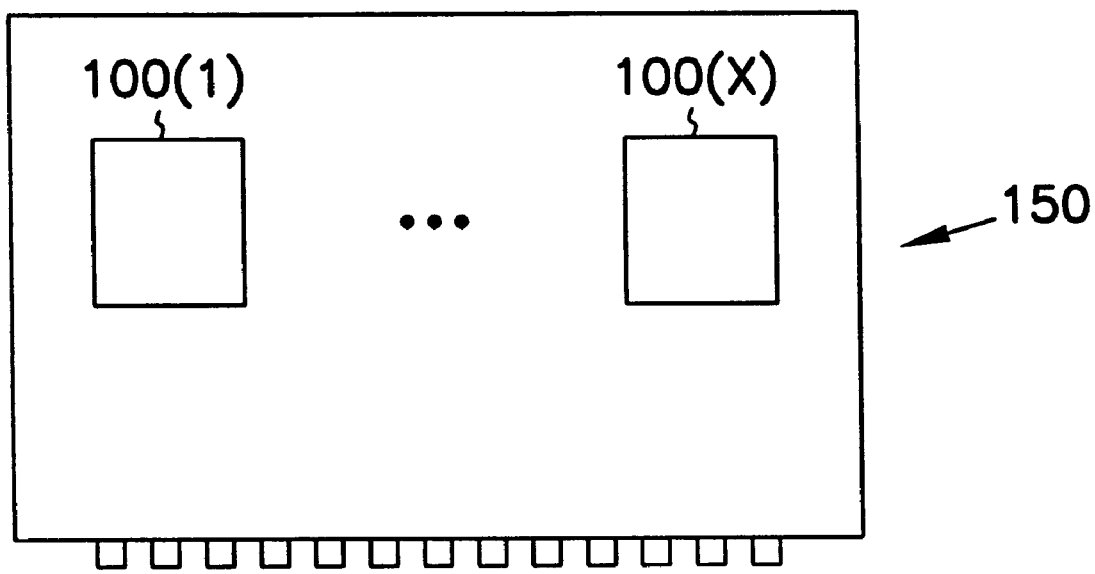
FIG. 1C is a detailed diagram of a flash memory card.

It will be appreciated that more than one Flash memory can be included in various package configurations. For example, compact Flash memory cards 150 can be manufactured in varying densities using numerous Flash memories 100(1)–100(x) as illustrated in FIG. 1C. See "1997 Flash Memory Data Book" pages 3-1 to 3-3 available from Micron Quantum Devices, Inc. (incorporated herein by reference) for a more detailed description of a Flash memory card.

Ring Oscillators

A ring oscillator is typically comprised of a series of inverting circuits connected in a ring. A ring oscillator circuit 200 is illustrated in FIG. 2. The oscillator can include a control circuit 202 which is used to start and stop the oscillator. See U.S. Pat. No. 5,519,360, entitled "Ring Oscillator Enable Circuit with Immediate Shutdown" issued May 21, 1996 for a description of a ring oscillator control circuit. The control circuit can be eliminated if it is desired that the oscillator operate continuously. A series of inverters 204(a)–(x) are connected in a ring fashion through control 202. To insure that the output signal (Out) oscillates, the total number of inverting stages is designed to be an odd number. The ring oscillator circuit of FIG. 2 has been simplified and is intended to provide a basic understanding of ring oscillators.

Adjustable Ring Oscillator

An adjustable ring oscillator circuit is described which allows the use of a ring oscillator in place of a more accurate clock source such as a crystal, described above. The adjustable circuit can be used to compensate for performance differences experienced between ring oscillators that result from manufacturing variables.

The adjustable ring oscillator has selectable delay paths that allow for adjustment of the operating frequency. The delays are based on the characteristics of the material, such as silicon, used in the integrated circuit, as well as the ranges in temperature and voltage that the device is required to operate over. Taking these parameters into consideration, the maximum stages of the delay used for the ring oscillator should be calculated by using the design parameters which result in the fastest circuit operation (fast process, high voltage and low temperature). Further, enough stages in the delay loop should be provided to assure that the ring oscillator will oscillate at the minimum frequency that is desired for the design.

Once the number of delay elements has been established to guarantee the minimum operating frequency, the slow parameters should be analyzed to assure that any maximum frequency settings can be guaranteed. Once the length of the loop has been established, the delay loop is divided into sections that can be selectively activated.

FIG. 3 illustrates one embodiment of an adjustable ring oscillator 300 which includes seven delay stages. The delay stages are comprised of a blocking NAND gate 304(1)–(6) combined with an inverter 302(1)–(6). The delay elements are non-inverting delays. The first delay stage is comprised of inverter 302(0). The output of each delay stage D0–D6 can be selectively coupled to the input node 306, as explained below. NAND gates 304(1)–(6) are coupled between successive delay stages. A second input to the NAND gates B1–B6 can be used, as detailed below, to selectively decouple unused delay stages to reduce power consumption. B1–B6 are referred to herein as Block signals.

Figure 4:
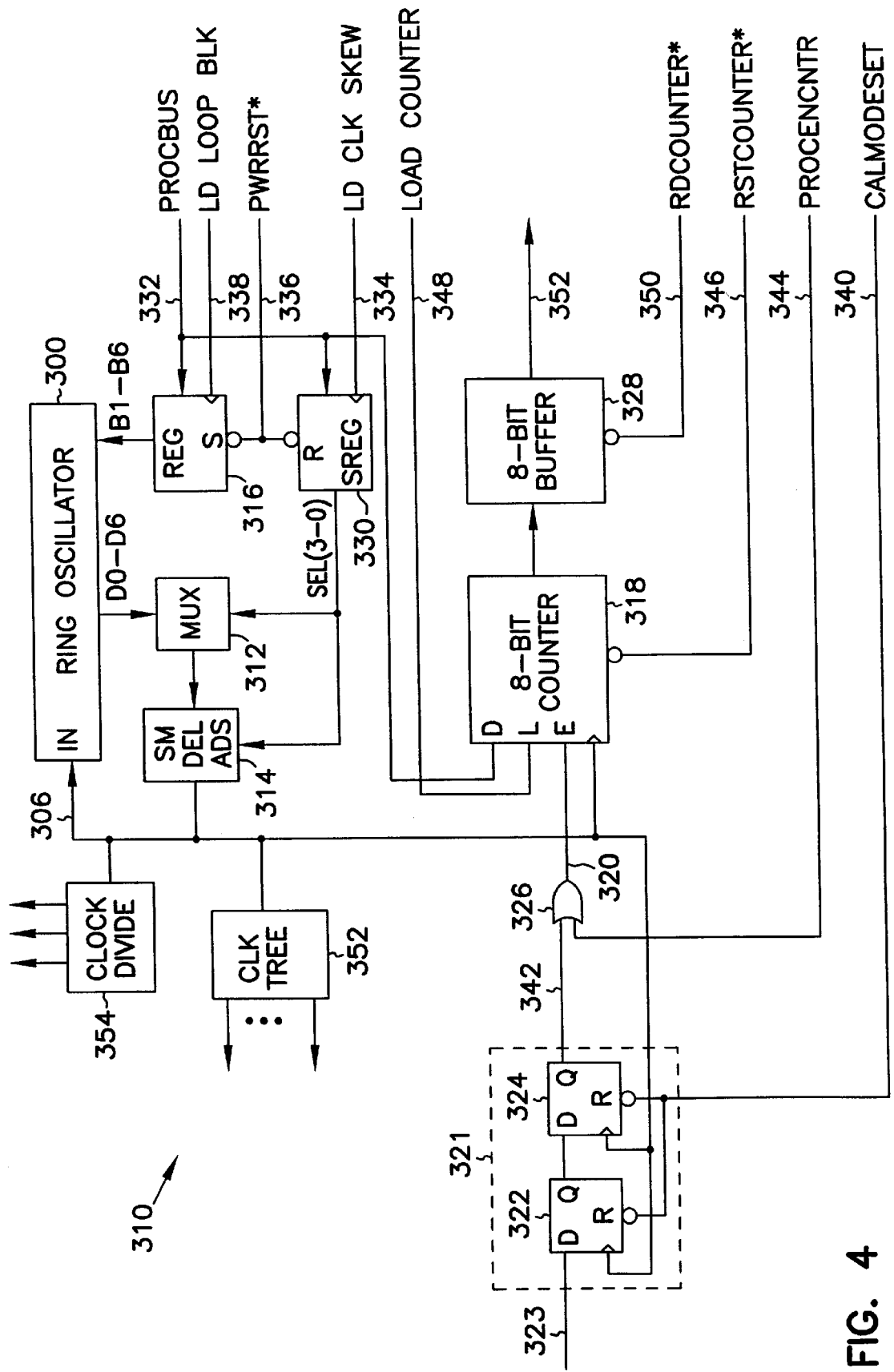
FIG. 4 is a schematic diagram of a ring oscillator adjustment circuit.

FIG. 4 illustrates one embodiment of a ring oscillator adjustment circuit 310. The adjustment circuit includes a ring oscillator 300 and circuitry to control the delay stage feedback and de-couple unused delays. The output of one of the delay stages D0–D6 is coupled to the input 306 of the ring oscillator through multiplex circuit 312 and small delay adjust 314. The clock signal provided on this input can be fine adjusted using a small delay adjustment circuit 314. Register 330 provides signals to control multiplex circuit 312 in response to control data and provided on bus lines 332. A register circuit 316 is provided to selectively couple the NAND gate inputs B1–B6 to a low voltage potential to disable, or de-couple delay stages which are not required. The register operates in response to a register value stored in non-volatile memory of the integrated circuit and provided on bus lines 332. This allows for a reduced power consumption during ring oscillator operation. It will be understood that other circuitry, such as clock signal dividers 354, can be de-coupled in the same manner by using a value stored in a table, as described below. Thus, the ring oscillator output frequency, and unused circuitry can be controlled by data values stored in a table configuration located either external to the integrated circuit or in the integrated circuit.

Referring to FIG. 4, the ring oscillator 300 is coupled to a multiplex circuit 312 via delay element tap lines D0–D6. One of the delay element tap lines is coupled to optional small delay adjust circuit 314. The small delay circuit is then coupled to the input of the oscillator to complete the oscillating ring. Multiplex circuit 312 is coupled to select register 330 which provides output signals. The multiplex circuit uses these output signals for selecting one of the multiplexed inputs. The small signal delay circuit is also coupled to register 330 for using the output signals to control fine adjustment of the ring oscillator. The register 330 receives data from an external processor, or test circuit, via bus 332. A Load Clock Skew line 334 is used to load register 330 with data presented on bus 332.

Node 306 of the ring oscillator 300 is coupled to both a clock signal tree circuit 352 for clock signal distribution to portions of the integrated circuit, and to a divider circuit 354 for reducing the frequency of the clock signal. For example, divider circuit 354 can comprise divider stages to divide the clock signal by 2, 4 or 8. Divider circuit 354 can include disable circuitry to disable unused dividers. That is, as the frequency of the ring oscillator changes, some of the dividers may not be required and can be disabled from toggling to reduce power consumption.

Register circuit 316 is coupled to the ring oscillator block inputs B1–B6 to selectively de-couple, or disable, delay stages which are not required. The register is coupled to bus 332 and Load Block line 338 to load the register with a data value. The data value de-couples the unused delay stages by latching one of the NAND gate outputs in a low state preventing passing of the clock signal. A Power Reset* signal line 336 is coupled to both register 316 and register 330 to force the state of the registers when power is applied to the integrated circuit. This reset signal insures that the oscillator will begin functioning with maximum delay stages, thereby producing a slow frequency clock signal. The power reset forces register 316 to the set state, allowing the full range of delays to be operational.

A two-stage shift register 321 is provided using flip-flop circuits 322 and 324. The flip-flops are enabled using a Calibrate Mode signal provided on line 340. The Calibrate Mode signal is active during a special calibrate operation. This operation is preferably conducted after the integrated circuit is manufactured and installed in a finished product. Calibration can also be performed prior to installation in a system. NOR gate 326 is provided to couple either the output line 342 of flip-flop 324, or Processor Enable Counter signal provided on line 344 to counter circuit 318.

Counter circuit 318 receives a Reset Counter* signal on line 346 to reset the counter. The counter counts clock signal pulses from node 306 when either the Calibrate Pulse or the Processor Enable Counter signal force line 320 to a high state. The counter can start counting at zero, or at an offset value loaded using bus 332 and a Load Counter signal provided on line 348. The Processor Enable Counter signal is used to enable the counter circuit 318 for use by the processor for non-calibration use. That is, after the calibration of the oscillator is completed, the counter circuit can be used by the processor for addition purposes.

The output of counter 318 is coupled to an eight bit buffer circuit 328. The buffer passes the status of the counter in response to a Read Counter* signal provided on line 350. The output line 352 of buffer 328 is coupled to the processor and compared to a predetermined count value during calibration, as described below.

To further understand the ring oscillator adjustment circuit 310, the calibration of the circuit is described. Calibration of the ring oscillator will normally be a one time event, done at initial manufacturing time. The illustrated embodiment does the calibration by using counter 318 to count ring oscillator signal pulses for a duration of time specified by an externally applied pulse provided on node 323. The external pulse is generated while the integrated circuit is in a special test mode that allows use of a device input pin for receiving a Calibrate Pulse of a pre-determined length.

A shift register 321 comprised of flip-flops 322 and 324 shift the Calibrate Pulse signal to an input of OR gate 326. The two flip-flops are used to synchronize the calibrate pulse to prevent metastability and provide for a more accurate measurement. The output 320 of the OR gate is coupled to the enable node of counter 318. When either of the inputs of the OR gate is at a high state, the counter is enabled. Thus, either the Calibrate Pulse or a Processor Enable Counter signal can be used to activate the counter circuit.

The counter is coupled to the ring oscillator at node 306, and when the Calibrate Pulse is deactivated, the counter contains a value that indicates the frequency of the ring oscillator. The value of the counter is then displayed in buffer 328 in response to a Read Counter* signal. The output 352 of buffer 328 is compared to a pre-determined frequency by the test system to see if the ring oscillator is functioning within the proper frequency range.

For example, an applied Calibrate Pulse signal length can be selected to give a binary count of F, or 80, from the counter 318. An output value greater than 80 will indicate the frequency of the ring oscillator is too fast and needs to be slowed, while a count less than 80 will indicate that the oscillator is operating too slow. If the ring oscillator is operating at the wrong frequency, the test circuitry selects different ring oscillator delays using the multiplex circuit 312 and retries the counting procedure. This iterative procedure is repeated until the optimal center operating frequency is obtained. Once the center frequency is determined, the multiplexer delay selection settings for the ring oscillator are stored in a special parameter file located within the integrated circuit, or flash memory system. A small delay adjustment can be made by using circuit 314. This delay circuit is provided to allow fine adjustment of the ring oscillator. The small delay is preferably half of the delay time of the delay stages of the ring oscillator. Thus, coarse adjustment of the frequency can be made by controlling the delay stages of the ring oscillator, and fine adjustments can be made using circuit 314.

After the multiplexer delay selection settings value is stored in the special parameter file, the initial calibrating is complete. As stated above, calibration is used to adjust the clock frequency for manufacturing variables. There are several ways to design the calibration/test interface. One method has a direct hardware path to test circuitry and a read-back path from the counter. A second method is a command method, using normal hardware registers to pass command setup to the integrated circuit and return count values to the test circuitry, as well as pass delay settings back to be loaded and used. In this invention the preferred method uses an Advanced Technology Attachment (ATA) interface, passing commands and parameters through a Task File. In this manner, hardware is reduced and the Flash memory controller is able to better control and monitor its own hardware when functioning in a system. The counter can also be used for other functions so better overall use by the Flash system is assured.

After the ring oscillator frequency adjustment is complete, the controller can be powered down and upon power up it will use the stored data to set the ring oscillator to the proper setting. This is accomplished by reading the value from the file stored in Flash memory and reloading the value into the delay selection register 330. The ring oscillator switches to the desired delay paths and begins operating at the calibrated setting. When the power is turned on, or reset, the delay multiplex selection register is set to a state that has the ring oscillator select the maximum delay path, assuring that the system does not begin operating at a frequency that is too fast for the system. This slow initial setting should allow the device to always power up and function, independent of the process, temperature and voltage variables.

It is important that the process of switching of the delay paths of the ring oscillator be done in a manner so that spurious clock pulses are not generated. Further, when changing the number of delay stages in the ring oscillator, care must be taken to insure that an odd number of inverting circuits remain in the ring.

Environmental Adjustments

Once the fundamental operation of the oscillator is established as described above, the dynamic operation of the oscillator can be invoked. As the temperature of the system changes, the operating characteristics of the circuits will speed up at lower temperatures, and slow down at higher temperatures. To adjust for this change and keep the system running at the ideal frequency, the temperature of the system needs to be monitored. To allow for such monitoring in the system, the Flash Memory 100 incorporates a temperature detector that detects a range of temperature that the integrated circuit is operating within. As explained below, the temperature detector can be located inside an external memory controller 102.

Figure 5:
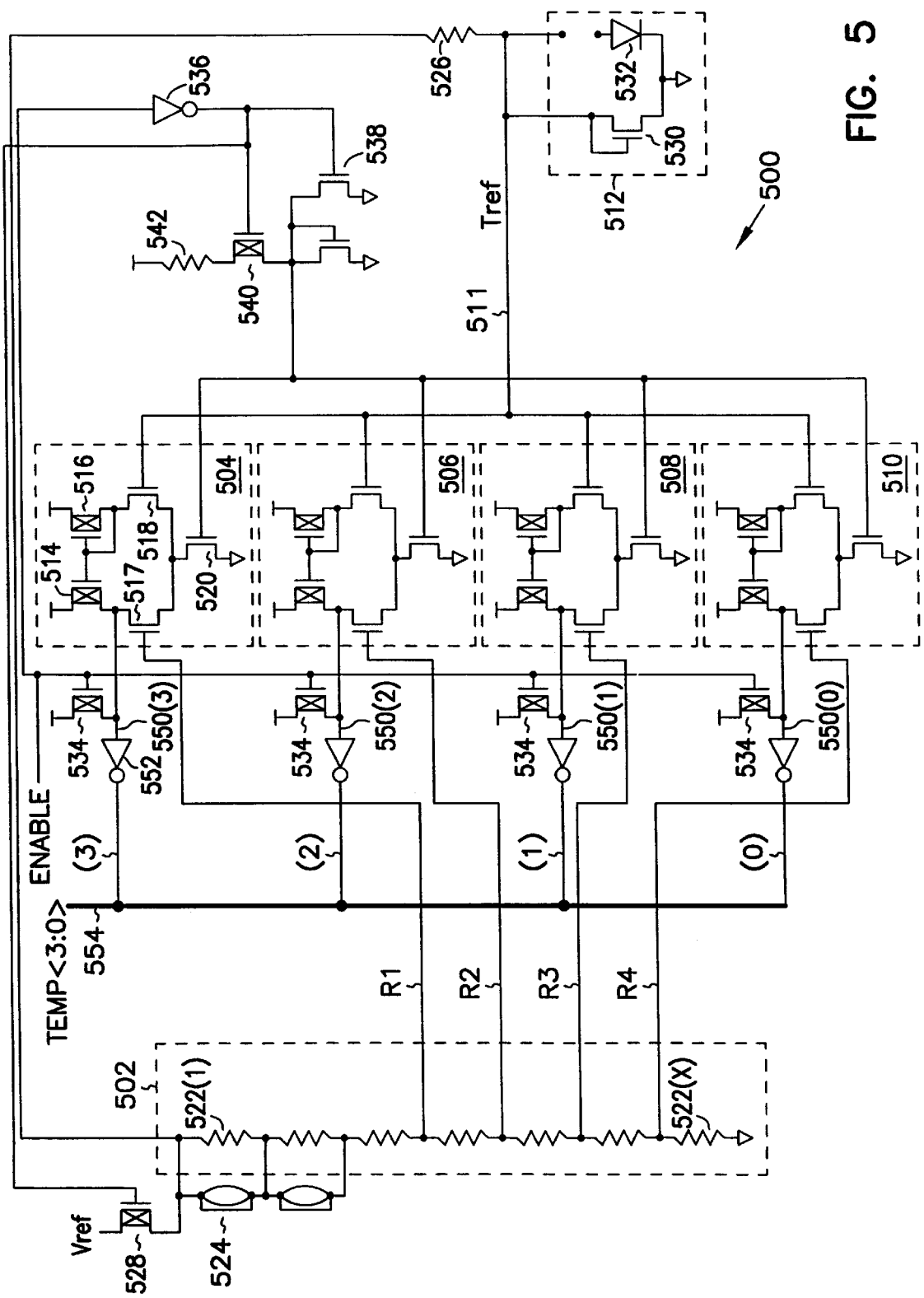
FIG. 5 is a schematic diagram of a temperature detector circuit.

Referring to FIG. 5, a four bit temperature detector circuit 500 is described. The temperature detector circuit 500 includes a voltage divider circuit 502, or resistor ladder, which provides reference voltages R1–R4. The resistors 522(1)–522(x) of the voltage divider are preferably fabricated as n-well resistors, but can be any type of integrated circuit resistors. Optional bypass conductors 524 can be provided in the resistor ladder to bypass a resistor for fine adjustments of the voltage divider. The bypass conductor can be either a maskable conductor, or fusible conductor.

The temperature detector includes four differential amplifiers 504, 506, 508 and 510 which are coupled to the voltage divider circuit. The differential amplifiers are also coupled to receive a temperature reference voltage, Tref, provided by sensing unit 512 on node 511. Enable circuitry is also included in the detector circuit for resetting the four bit output signal to zero. It will be recognized by those skilled in the art that different comparator circuits can be used, and that the present detector should not be limited to the differential amplifier circuits illustrated.

Each of the differential amplifier circuits includes two p-channel transistors 514 and 516. Each differential amplifier circuit also includes n-channel transistors 517, 518 and 520. The gates of transistors 517 are coupled to the voltage divider to receive the reference voltages R1–R4. The gates of transistors 518 are coupled to node 511 to receive the temperature reference voltage, Tref. Transistor 520 is provided to disable the differential amplifiers when an enable signal, Enable, transitions to a low logic state, as further explained below.

Sensing unit 512 includes a diode connected n-channel transistor 530 and/or a P–N junction diode 532 coupled to node 511. Node 511 is coupled to a reference voltage Vref via resistor 526 and p-channel transistor 528. Because a threshold voltage of transistor 530 and diode 532 is temperature sensitive, the sensing unit 512 varies the temperature reference voltage, Tref, on node 511 in response to changes in the operating temperature of the integrated circuit. It will be appreciated that either transistor 530 or diode 532 can be used. Other temperature sensitive devices can be substituted for transistor 530 or diode 532 with some appropriate modifications to detector 500 to accommodate the new device. In FIG. 5, diode 532 is illustrated as being disconnected from node 511. The diode junction drop will vary with temperature, and the threshold voltage of the transistor will also vary with temperature, in both cases, about –2 mV/C. The voltage at node 511, therefore, will decrease by 200 mV for a 100° C. temperature increase. For a given temperature, the voltage on node 511 will be, depending on a manufacturing process, somewhere between approximately 0.6 and 1.0 volts.

Enable circuitry is provided to disable the temperature detector and reset the four bit output signal on bus 554. The enable circuit includes p-channel transistors 534 connected to the differential amplifiers, inverter 536 and n-channel transistor 538. An Enable signal input is coupled to the gates of transistors 534 and the input of inverter 536. The Enable signal is normally in a high logic state so that transistors 534 and 538 are turned off. When Enable is in a high logic state, transistors 520 are turned on through active transistor 540. Further, transistor 528 is turned on as a result of a low logic level output of inverter 536.

In operation, with the Enable signal high, reference voltages R1–R4 are provided to the gates of transistors 517, and the gates of transistors 518 are coupled to voltage Tref As the reference voltage Tref changes with changes in the temperature, the outputs 550(0)–550(3) of the differential amplifiers will change logic states. The outputs of the differential amplifiers are coupled to bus lines 554 through inverters 552 to provide a four bit output. In a preferred embodiment, the four bit output is used to indicate five different voltage ranges, as shown in Table 5.

TABLE 1

| Temp Range | Output (3) | Output (2) | Output (1) | Output (0) |
|---|---|---|---|---|
| Low | 0 | 0 | 0 | 0 |
| * | 0 | 0 | 0 | 1 |
| * | 0 | 0 | 1 | 1 |

TABLE 1-continued

| Temp Range | Output (3) | Output (2) | Output (1) | Output (0) |
|---|---|---|---|---|
| * | 0 | 1 | 1 | 1 |
| High | 1 | 1 | 1 | 1 |

It will be understood that a four bit output can provide sixteen different temperature ranges, however, the preferred five ranges, illustrated above, provide for simple circuitry without the need for encoding-logic. These five ranges could also be encoded on 3 output bits with a simple combination of logic gates.

To reset the temperature detector circuit 500 prior to sampling the output of the temperature detector, the Enable signal transitions to a low logic state to turn off transistors 528 and 540. Transistors 520 are also turned off in response to the activation of transistor 538. Transistors 534 are activated to force nodes 550(0)–550(4) to a high logic state. The four bit output, therefore, of the temperature detector is 0000. Finally, it will be understood that additional differential amplifier circuits can be added to increase the resolution of the temperature ranges.

By monitoring the temperature range of a memory device, the controller knows if the circuitry and oscillator are slowing down or speeding up. In a preferred embodiment, the memory has a temperature range register stored in the memory array that indicates what range of operating temperature the memory is presently experiencing. In the preferred embodiment, the exact temperature is not given, only a range value is given. This range value settings correlates to differing delays for circuit characteristics and for shifts in oscillator frequency. That is, a profile of delay shifts can be established by evaluating the integrated circuit characteristics and correlating this with measured changes. This information is then stored in a parameter table and is used by the controller to adjust the timing when a temperature range changes outside the nominal setting. The temperature range setting corresponds to an oscillator offset value that is used to alter the oscillator frequency, via a change in the delay stages, to compensate for the temperature range variations. Each temperature range setting corresponds to an oscillator delay setting, where nominal (room temperature) corresponds to the initial power on settings. Range settings outside this setting skew register 330 around this center delay setting.

The integrated circuit controller can check several memory devices and average the temperature range being sensed to better adjust to the actual temperature range present. This is particularly useful when a group of integrated circuits are provided on a circuit board which may experience different temperatures depending upon their physical location on the board.

In addition to the temperature adjustments made by the controller, the system has the ability to detect the range of voltage that the system is presently operating at and adjust for high or low ranges. Again, the voltage range is detected within the integrated circuit device. Like the temperature, the voltage range represents an offset from the nominal voltage setting. If the operating voltage is not at a nominal value, the controller adjusts the ring oscillator delay path to compensate for the voltage differential. Environmental parameters of the memory device, as referred to herein, include temperature, supply voltage and other external parameters which effect the performance of the memory device.

Figure 6:
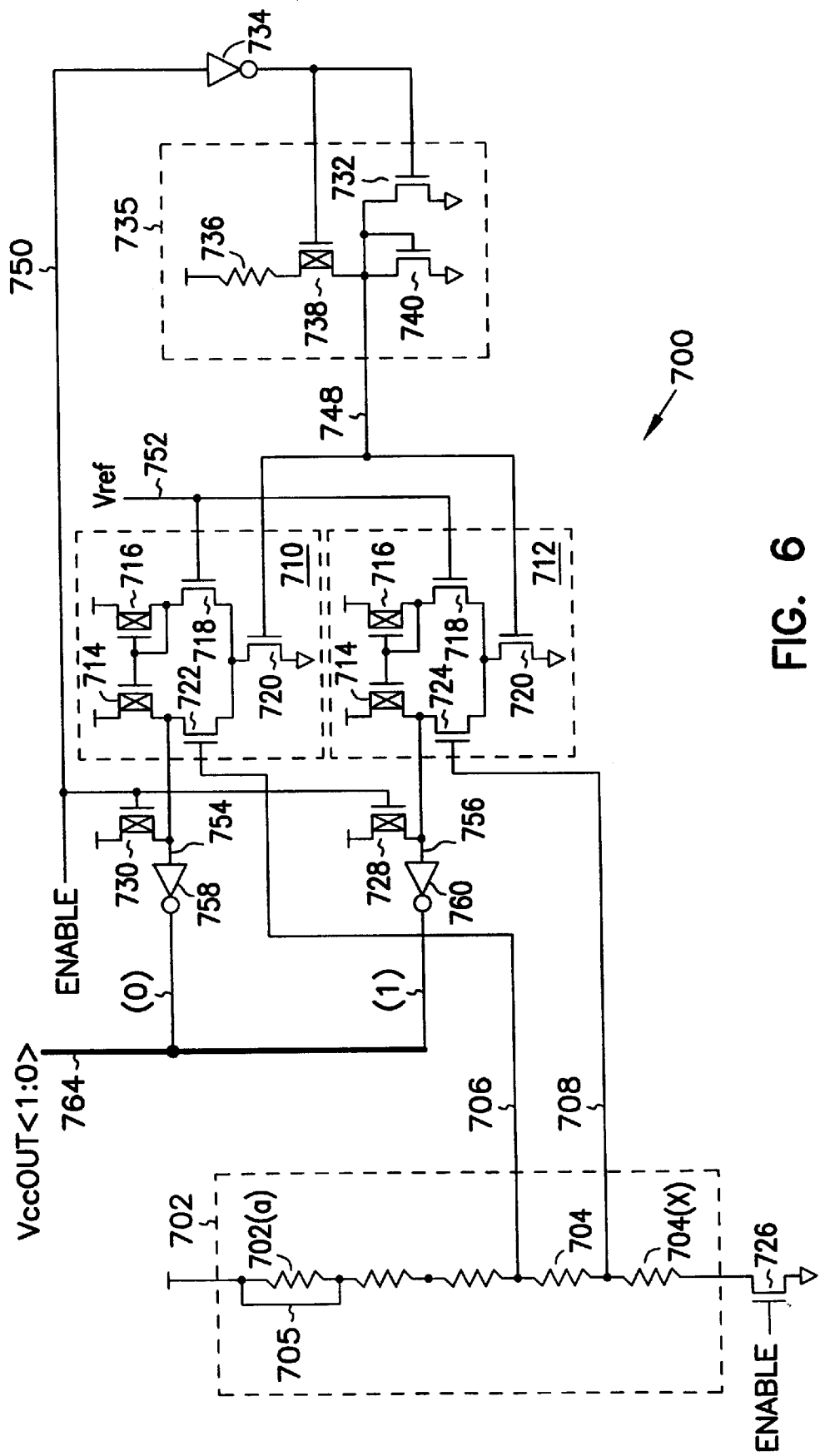
FIG. 6 is a schematic diagram of a voltage detector circuit.

FIG. 6 is a schematic diagram of one embodiment of a voltage detection circuit 700. The circuit includes a resistive ladder, or voltage divider circuit 702 having several resistors 704. Two sample nodes 706 and 708 are illustrated for coupling voltages from the voltage divider circuit to differential amplifier circuits 710 and 712, respectively. The resistors can be fabricated as n-well resistors, and the resistor ladder can have optional bypasses conductors 705 for adjusting the voltage divider. That is, the bypasses are conductive paths connected to each end of a resistor which can be opened using known techniques such as mask or fuse options. Each differential amplifier circuit includes two p-channel transistors 714 and 716. Each differential amplifier circuit also includes n-channel transistors 718 and 720. Differential amplifier circuit 710 has an n-channel transistor 722 coupled to node 706, and differential amplifier circuit 712 has an n-channel transistor 724 coupled to node 708. It will be recognized by those skilled in the art that different comparator circuits can be used, and that the present supply voltage detector should not be limited to the differential amplifier circuits illustrated.

Enable circuitry is included in the voltage detection circuit. The enable circuitry includes n-channel transistors 726 and 732, p-channel transistors 728 and 730, and inverter 734. An activation/disable circuit 735 is provided to control transistors 720 of the differential amplifier circuits 710 and 712. The activation/disable circuit includes resistor 736, p-channel transistor 738, and diode connected n-channel transistor 740.

In operation, the voltage detector is coupled to two input signals, Enable and Vref. The Enable signal is a normally high signal and resets the outputs of the voltage detector when it transitions to a low state. Vref is a reference voltage which is substantially insensitive to changes in the supply voltage, Vcc. Vref is preferably 2 volts and generated using internal circuitry. However, the reference voltage, Vref, can be externally provided on an input pin, and the exact potential value of Vref is not limited to 2 volts, but can be determined in conjunction with the values of the voltage divider and other circuits of the integrated circuit.

When the Enable signal is high, transistor 726 is turned on and a current path is formed through voltage divider 702. The voltages provided on nodes 706 and 708 will be dependant upon the level of Vcc and the values of resistors 704(a)–(x). Further, because Enable is high, the output of invertor 734 will be low. P-channel transistor 738 is coupled to the output of inverter 734 and will be turned on when the output is low. The output node 748 of the activation circuit 735 will be pulled high through resistor 736 and transistor 738. Transistors 720 of the differential amplifier circuits will be activated in response to output node 748.

When active, differential amplifier circuits 710 and 712 compare the voltage on nodes 706 and 708, respectively, with the Vref voltage. With reference to differential amplifier 710, if node 706 is higher than node 752 the output node 754 is pulled low. If a voltage on node 706 is lower than the Vref voltage, output node 754 is pulled high. Inverter 758 is provided to convert a voltage on node 754 into a digital signal. Differential amplifier 712 works in the same manner to provide an output signal on node 756.

A two-bit output signal is therefore provided to indicate the current value of the supply voltage. It will be appreciated that a two-bit output cannot represent all possible values of Vcc at a high resolution, and that the output is preferably used to provide a voltage range of Vcc. Assuming a Vref voltage of 2 volts, the following table illustrates a three range detector using Output (0) of inverter 758, and Output (1) of inverter 760.

TABLE 2

| Vcc | Output (1) | Output (0) |
|---|---|---|
| <2.6 | 0 | 0 |
| 2.6 < Vcc < 3.1 | 0 | 1 |
| >3.1 | 1 | 1 |

It will be understood that a two bit output can provide four possible voltage ranges. Table 2, however, illustrates a three voltage range scheme which does not need to be decoded. A four voltage range scheme can be provided with an additional differential amplifier and simple logic to encode a two bit output.

To enable the voltage detector circuit 700 prior to sampling the output of the voltage detector, the Enable signal transitions to a low logic state to turn off transistor 726. Transistors 720 are also turned off in response to the activation of transistor 732. Transistors 728 and 730 are activated to force nodes 754 and 756, respectively, to a high logic state. The two-bit output signal, therefore, of the voltage detector is a logic 00.

It will be understood that additional differential amplifier circuits can be added to increase the resolution of the voltage ranges. In this embodiment, additional resistors and sample nodes will have to be added to the voltage divider circuit 702.

Figure 7A:
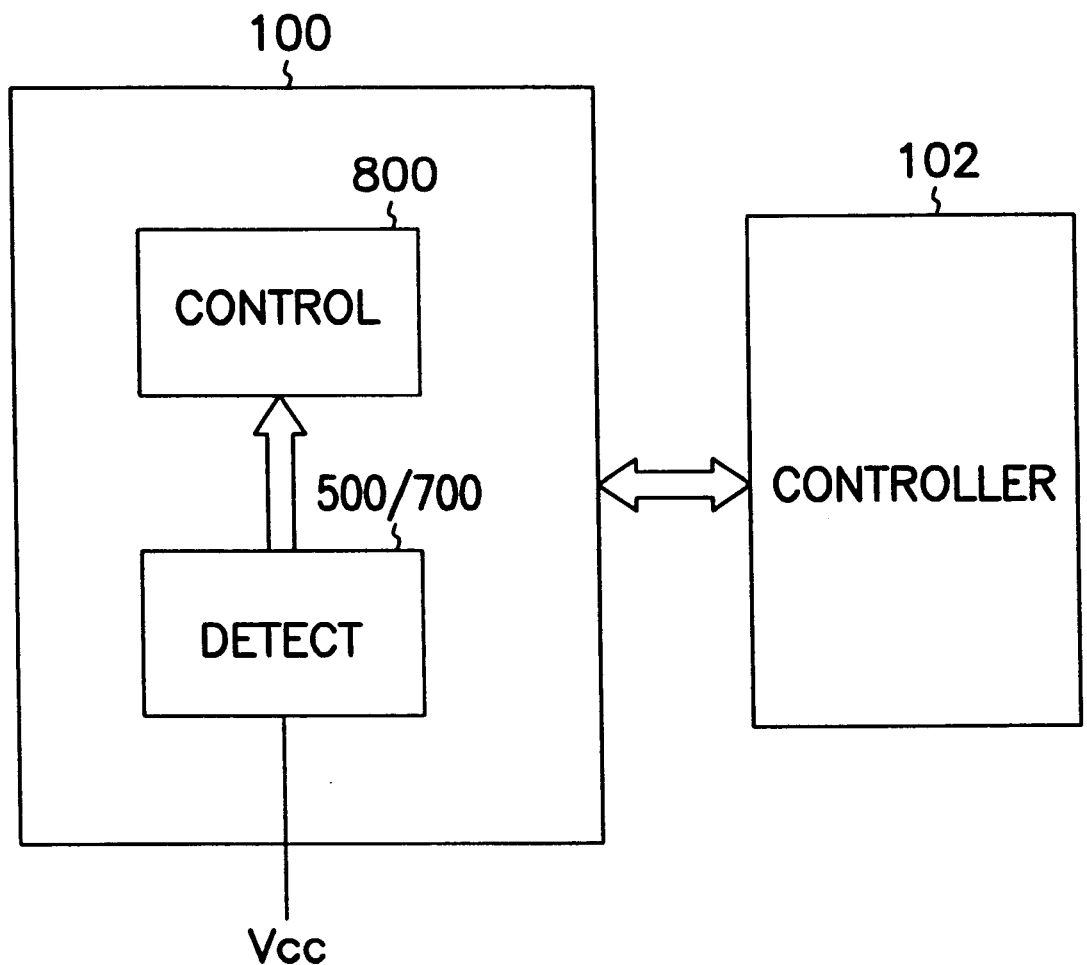
FIG. 7A is a block diagram of an integrated circuit incorporating a detection circuit.

The detection circuits can be incorporated into the system in several different manners. FIG. 7A is a block diagram of an integrated circuit 100 which includes a control circuit 800 for controlling the operation of the integrated circuit and a voltage supply and/or temperature detection circuit 500/700. The integrated circuit can be coupled to an external controller or processor 102. The control circuit 102 can receive output data from the detector and determine the present range of the supply voltage or temperature. The control circuit can then adjust operating parameters of the integrated circuit in response to the detected supply voltage level. The detection circuit can be operational at all times when the integrated circuit is operational, or the detection circuit can be selectively operated only in response to a sample request. If the detection circuit is sampled, the output can be stored in a latch for continued use by the integrated circuit when the detection circuit is inactive, see FIG. 8B described in detail below. The output signal from the detector can be either analog or digital, and additionally can be a multiple-bit signal.

Figure 7B:
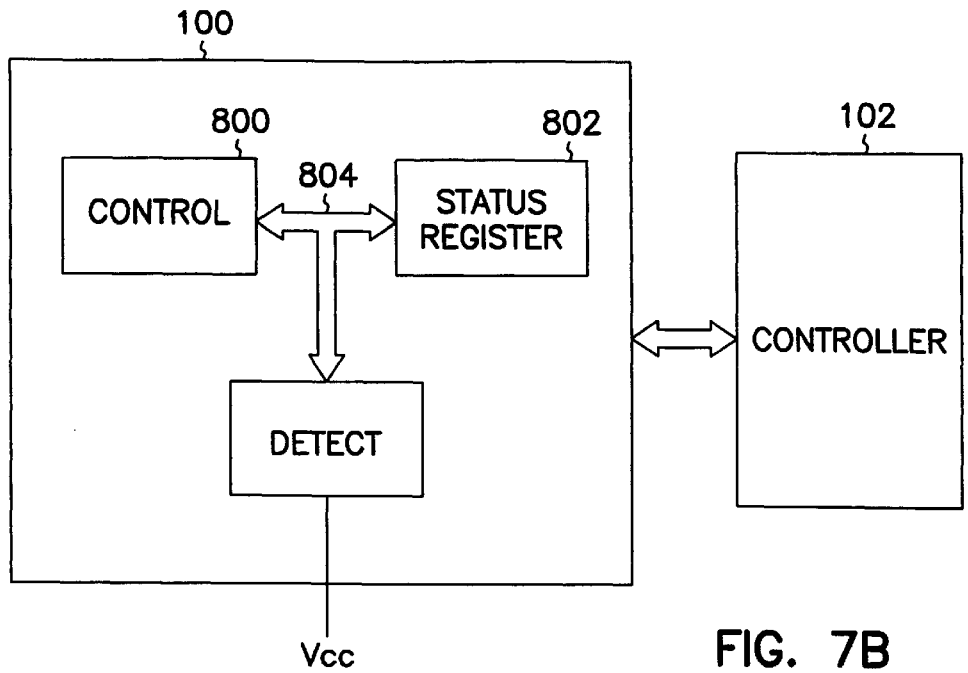
FIG. 7B is a block diagram of an alternate integrated circuit incorporating a detection circuit.

Referring to FIG. 7B, a block diagram is provided of an integrated circuit 100 including control circuitry 102 for controlling the operation of the integrated circuit, an optional status register 802, and a detector circuit. The integrated circuit is coupled to an external controller. In operation, the detector circuit outputs a signal on bus 804. The output can then be used directly by the control or latched in status register 802. The status register can be either a volatile or non-volatile latch circuit. The control circuit 800 can then use the data stored in the status register to determine the current voltage range of Vcc.

Figure 7C:
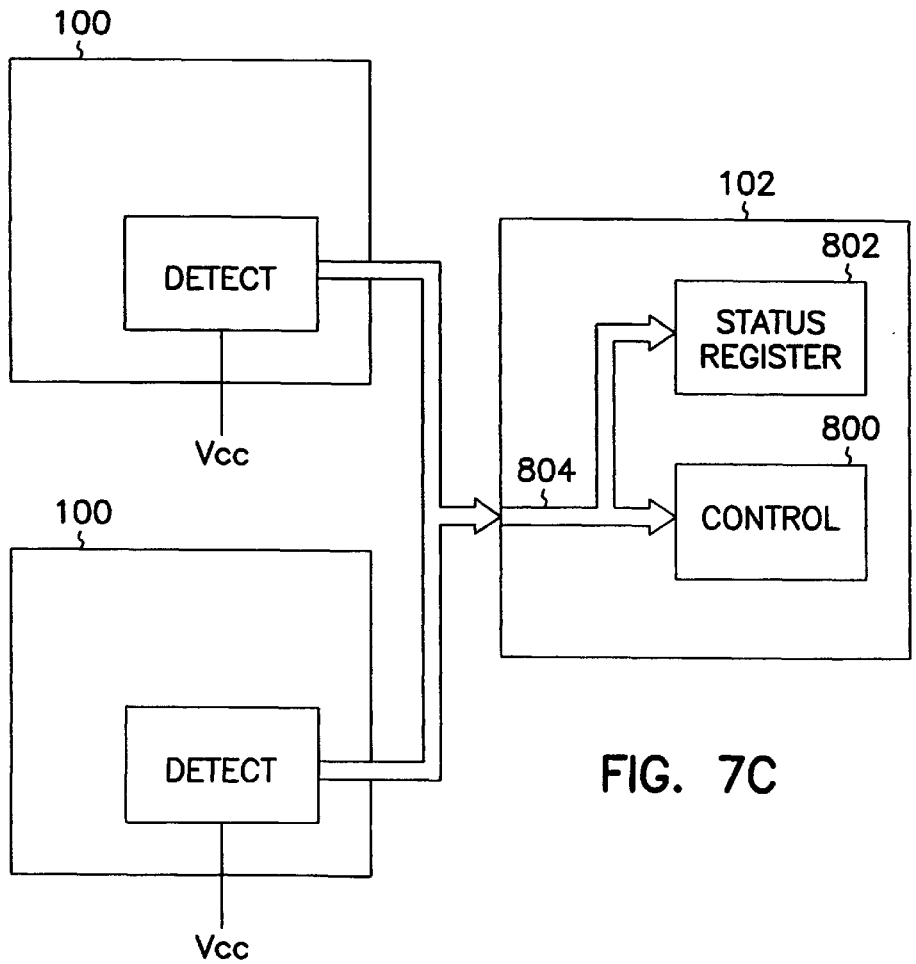
FIG. 7C is a block diagram of a system having a detection circuit.

FIG. 7C is a block diagram of an alternate system having multiple integrated circuits 100. Each circuit includes a detector which provides output signals to an external controller 102. The processor includes control circuitry 800 and an optional status register 802. This system allows one processor to monitor several integrated circuits simultaneously. It will be understood that in another embodiment, the control circuit 800 can be included in each integrated circuit 100, and the status register located in an external device. Further, the detection circuit and status register can be located in the controller 102.

It may be desired to use a look-up table for comparing output from the detection circuit with recorded data to determine an operating parameter. The look-up table can be located in the integrated circuit 100, such as a portion of non-volatile memory, or it can be located externally. To produce the data initially stored in the look-up table, testing of the circuit under known conditions is conducted.

When adjusting for both temperature and voltage variables, the status of both must be taken in conjunction with one another to determine the final oscillator delay setting. One variable may add delay while the other may remove delay, thereby offsetting each other. In contrast, both variables may add or remove delay in the same direction, resulting in major shifts in one direction. The firmware in the controller reads the temperature and voltage settings, determines the offset value for each variable, adjusts the combined valued by addition or subtraction, and adjusts the delay register value. Therefore, the oscillator operating frequency is changed to compensate for the environmental conditions in which the integrated circuit is operating.

In a preferred embodiment, the controller checks the environmental variables and makes appropriate adjustments to the oscillator at specific times during operation. Some of the check times in a Flash memory device include:

1) upon power up of the integrated circuit;
2) when the circuit is in an idle state;
3) when an error is detected in operation (Read ECC Error);
4) when a predetermined number of program verify failures are detected;
5) when an erase failure is detected;
6) in response to a user command to check and adjust;
7) in response to a user command to load given adjustment values;
8) before attempting a program operation; and
9) before attempting an erase operation.

The controller maintains a special file that contains flags for these conditions. If the flag is set, the controller adjusts the oscillator according to the temperature and voltage settings.

It will be understood by those skilled in the art that the offsets needed for changes in voltage and temperature are circuit dependant. As such, testing is required for an integrated circuit design to determine performance characteristics over operating variables. In the preferred embodiment when adjusting for temperature changes, therefore, the controller reads a table stored in Flash memory.

With a temperature readout and a voltage readout the system generates an operating table that can be used to adjust for dynamic changes in voltage and temperature as they occur during system operation. Various methods of developing a table are possible, especially considering the design variations possible with the ring oscillator construction. In addition to these variables, there are two types of tables that can be constructed. One table optimizes to maintain a central operating frequency. A second table allows for varying the frequency, dependent upon the operating conditions to produce the best system performance. Both approaches are discussed in the following sections. It should be understood that a wide range of ways to build and use the tables are possible and that the method described is one approach presently contemplated.

In a flash storage system the type of adjustment method may vary between customers (users) and can be selected by developing both tables during manufacturing. A flag can then be set indicating which method to use during operation. In some systems it may be best to pick a method and build the skewing into hardware to switch oscillator settings as the temperature and voltage change automatically. For the initial system implementation we have selected the clock adjustments through firmware to allow for maximum flexibility.

To keep a constant clock frequency, the hardware and firmware act in unison to move the oscillator as to the temperature and voltage changes. If the temperature gets hotter (indicating slower silicon and slower ring oscillator) the flash system will move the oscillator settings to the faster settings to compensate for the slow down because of increased temperature or a corresponding decrease in operating voltage.

A table of the voltage/temperature is made to show the cause and effect of the parametric changes along with the skew register 330 setting required to achieve the proper compensation. Table 3 shows how the compensation works. It is not required that all delay values in a ring oscillator may be used for a particular table. Because of the initial centering of the oscillator at manufacturing calibration, the center value will vary, so room must be left on the top and bottom to allow room for a range of variations around the center point. Once the oscillator is calibrated, the table is built by adding or subtracting the delay from the nominal selection.

TABLE 3

| | VOLTAGE | TEMP. | SELECT REGISTER | DELAY OFFSET | DELAY PATH |
|---|---|---|---|---|---|
| LOW VOLTAGE | 00 | 0000 (Low) | 100X | +1 | D4 |
| | 00 | 0001 | 011X | 0 | D3 |
| | 00 | 0011 | 010X | −1 | D2 |
| | 00 | 0111 | 001X | −2 | D1 |
| | 00 | 1111 (High) | 000X | −3 | D0 |
| MEDIUM VOLTAGE | 01 | 0000 | 101X | +2 | D5 |
| | 01 | 0001 | 100X | +1 | D4 |
| | 01 | 0011 | 011X | 0 | D3 |
| | 01 | 0111 | 010X | −1 | D2 |
| | 01 | 1111 | 001X | −2 | D1 |
| HIGH VOLTAGE | 11 | 0000 | 110X | +3 | D6 |
| | 11 | 0001 | 101X | +2 | D5 |
| | 11 | 0011 | 100X | +1 | D4 |
| | 11 | 0111 | 011X | 0 | D3 |
| | 11 | 1111 | 010X | −1 | D2 |

To use Table 3, the following sequence is done by the Flash System. First the voltage range is read from the voltage detection circuit. The value read will be used to point to 1 of 3 tables, for this example. If more voltage states were decoded, then more tables would be required and would correspondingly be generated. Once the proper temperature table is picked from the voltage detector, the temperature value is read using the temperature detector. The temperature value read corresponds to a select register value to be loaded into the select register 330 to select the path that will maintain the desired operating frequency for the operating conditions evaluated. Thus, Table 3 illustrates the value which is to be loaded into register 330 (Select Register). The Delay Offset shown in Table 3 illustrates the delay path offset, where 0 is a nominal (calibrate) path and +1 is a longer path (slower clock) and −1 is a shorter path (faster clock). The delay path corresponding to the embodiment of FIG. 3 is also illustrated using D0 to D6.

Assuming that a nominal voltage 01 and nominal temperature 0011 result in a calibration using select register value 0110 (delay path D3), if during operation the voltage is read as 00 (low voltage), and the temperature is read as 0111, a selection setting is retrieved from a low voltage/temperature table for this reading which is 0010 (delay path D1). The oscillator clock frequency is thus maintained over variations in environmental changes.

Before a new delay path is loaded into the register 330, caution must be taken not to load a value that is blocked by the power saving blocking signal (see signals B1–B6 of FIGS. 3 and 4) from register 316. If a value of selection is forced beyond the block point, then the oscillator will stop functioning and the system will lock up. To prevent this from occurring, the blocking functions should all be set to the non-blocking state (all logic ones), followed by a load of the new select delay. After the new select delay is loaded, the system will index a blocking table and load the blocking value into register 316 to halt operation in non-used oscillator delay stages. Table 4 shows how this is accomplished. The selected register value corresponds to direct hardware blocks required for signals B1 to B6.

TABLE 4

| SELECT REGISTER | B1 | B2 | B3 | B4 | B5 | B6 |
|---|---|---|---|---|---|---|
| 000X | 0 | 0 | 0 | 0 | 0 | 0 |
| 001X | 1 | 0 | 0 | 0 | 0 | 0 |
| 010X | 1 | 1 | 0 | 0 | 0 | 0 |
| 011X | 1 | 1 | 1 | 0 | 0 | 0 |
| 100X | 1 | 1 | 1 | 1 | 0 | 0 |
| 101X | 1 | 1 | 1 | 1 | 1 | 0 |
| 110X | 1 | 1 | 1 | 1 | 1 | 1 |

Any logic block that has selectable clock adjustments can be adjusted per the temperature and voltage offsets described above. In a Flash memory system it is possible to control the DMA Read Clock, the DMA Write Clock, the Processor Clock, the Sequencer Clock (if present), and the Host DMA Clock. In the same manner, parameter adjustments for the Flash operation can be controlled. For example, a program pulse that is nominally set to 10 microseconds may be set to 15 microseconds if a high temperature is detected. This will insure that an error is not incurred during programming. Substantial performance improvements are experienced by eliminating the need to re-program data if the program pulse duration was too short. The program pulse width can also be decreased to increase the program operation if the operating parameters permit.

In addition to the program pulse, numerous operating characteristics of the integrated circuit could be adjusted. For example, in a Flash memory the following parameters could be controlled: Program Voltages; Program Time; Erase Voltages; Erase Time; Program Verify level; Erase Verify level; Preprogram Voltages; Preprogram Time; Heal Voltage; Heal Time; and Read offset (nominal trip point varied with voltage and temperature). It will be recognized by those skilled in the art that if a system does not have to adjust for both temperature and voltage at the same time, a simple method of reading the value from either the temperature or voltage sensor can be implemented which includes indexing into a table containing a direct oscillator register setting. Further, if one parameter dominates, a table for that parameter can be used and the subordinate parameter can be handled by a +/− offset from the dominate table value.

The above-described memory and circuitry is provided to allow for dynamic adjustment of the clock frequency over variations in environmental parameters. The memory, therefore, can use a less expensive oscillator, such as a ring oscillator. The performance of the memory is thus maintained over changes. In another embodiment, the memory can increase performance over environmental parameters.

Power Consumption

In a system that is concerned with power consumption and ways to alter the power based on the intended usage, clock division circuitry is often used. The clock division circuitry can then be selected for the performance and function desired. Clock Divide 354 is an example of such an application. In typical systems, the clock divide circuitry is left running or is turned off in total. A better method is to use enables on each divide stage to halt clock signals on stages not used. A blocking register can be applied to this clock divide circuitry, just as it was for the oscillator.

Figure 8:
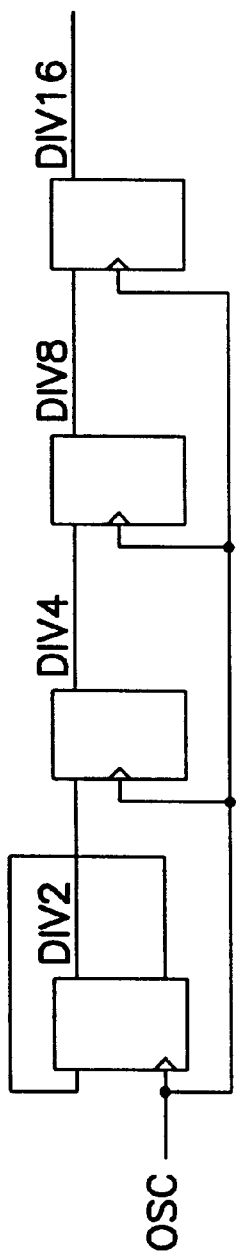
FIG. 8 is a diagram of a prior art clock divide circuit.
Figure 9:
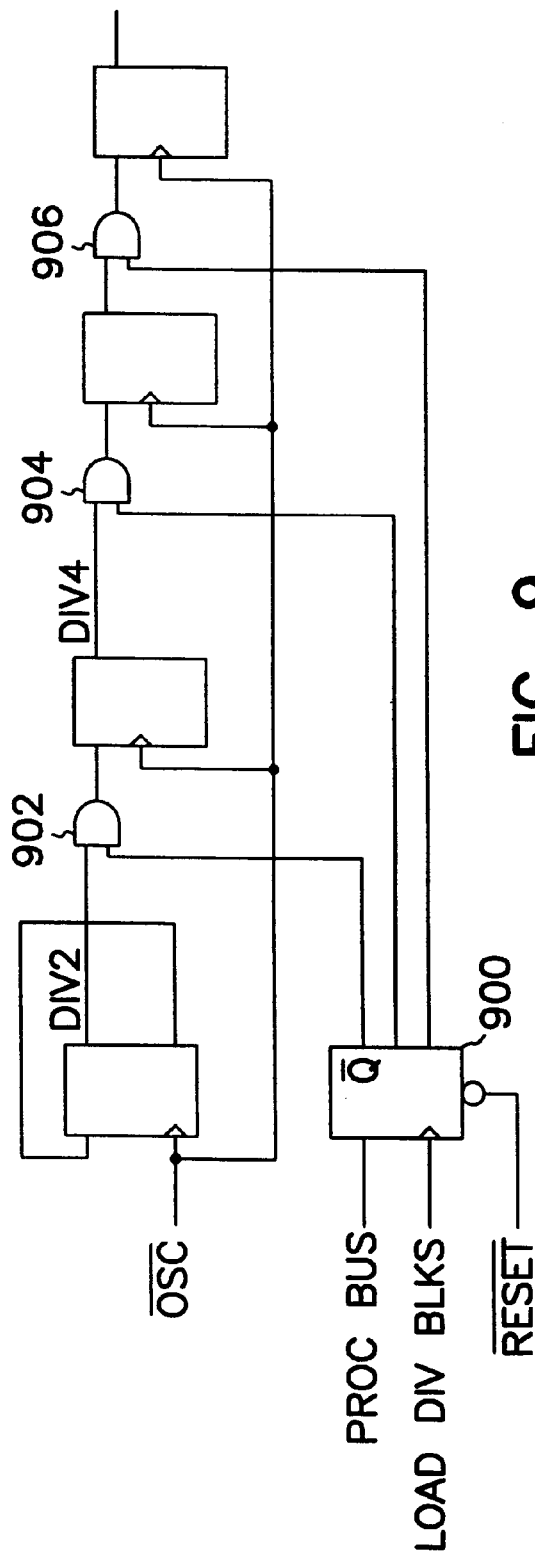
FIG. 9 is a diagram of a clock divide circuit of the present invention.

FIG. 8 is a diagram of a prior art clock divide circuit which has four stages to provide divide by 2, 4, 8, and 16 signals in response to an oscillation signal. FIG. 9 is one embodiment of clock divide 354. The circuit includes four stages to provide divide by 2, 4, 8, and 16 signals in response to an oscillation signal. An enable gate 902, 904, or 906 is provided between stages to turn off unused stages. A register 900 can be loaded following the same method described above for register 330.

In general, the method of blocking clocks as described above can be used throughout a Flash System to allow signals to be active only when some function is dependant upon them. By activating and deactivating the various clocks in the Flash System power savings will be realized.

Increased Circuit Performance

In addition to the above timing adjustments made to optimize the overall system, the present state of environmental variables can be used to allow the system to operate at its design limits or in some cases exceed the overall criteria of operation. That is, integrated circuits are designed to operate over a range of temperatures and voltages. A "guard band" must be incorporated by designers to insure that a design operates over all specified conditions. The operational performance of the circuit under nominal conditions, therefore, must be reduced to allow for the possibility of extreme variables. If the circuit temperature and voltage are close to nominal levels, the circuit performance is below its potential.

If the controller determines that the integrated circuit is operating within a nominal temperature and/or voltage range, the clock frequency can be adjusted to maximize the operation of the integrated circuit. Further, if the environmental parameters are such that more aggressive operation is possible, clock frequency can be adjusted to maximize the operation of the integrated circuit. In such aggressive operation, the controller must monitor the circuit performance using an error detection method such as an ECC, or be closed loop such as have a program verify routine. If an error is detected, the environmental conditions will be read to determine if there has been a change. The clock frequency will be adjusted accordingly to eliminate errors. By using such techniques, overall performance of the system can be achieved.

If it is desired to operate a Flash System at maximum performance, then an alternate set of tables can be incorporated into the system. If the system is in a cold environment (0000) with high voltage (11) present, then the silicon in the system should be running at its faster capabilities. If the above described method is used, the clock is slowed to prohibit it from operating in the faster mode (delay offset of +1). This method maintains a standard operating speed over environmental conditions. By using an alternate set of tables, the system can be made to take advantage of the silicon characteristics. Care must be exercised in dong this to prevent undetected errors, or system operations that will fail to function. Extensive error checking and characterization of the system should be made to assure reliable data.

If the system is experiencing conditions where the operation should be slowed, then the center clock frequency should be used and the system should not be pushed for enhanced performance. If the system is at nominal conditions, then the clock may be sped up by some amount. If the conditions are indicating fast silicon conditions, then another step in increased speed may be taken. This method can be pushed to the confidence level of the designer and needs to be verified in simulation and extensive testing.

If this enhanced operation method is selected, then a table called Extended Performance is generated for use in the system. By incorporating oscillator adjustments as described above, a system can be made faster under certain conditions. In such a system, the firmware should have the capability of slowing the oscillator down when errors are detected. If the system operates without errors for a given period of time after experiencing errors, the controller should have the ability to generate a new table and begin operating from it.

TABLE 5

|  | VOLTAGE | TEMP. | DELAY OFFSET |
|---|---|---|---|
| LOW | 00 | 0000 (Low) | 0 |
| VOLTAGE | 00 | 0001 | 0 |
|  | 00 | 0011 | −1 |
|  | 00 | 0111 | −2 |
|  | 00 | 1111 (High) | −3 |
| MEDIUM | 01 | 0000 | 0 |
| VOLTAGE | 01 | 0001 | 0 |
|  | 01 | 0011 | −1 |
|  | 01 | 0111 | −2 |
|  | 01 | 1111 | −3 |
| HIGH | 11 | 0000 | +1 |
| VOLTAGE | 11 | 0001 | 0 |
|  | 11 | 0011 | 0 |
|  | 11 | 0111 | −1 |
|  | 11 | 1111 | −2 |

Table 5 illustrates one example of an extended performance table. The delay offset values have been adjusted to increase clock speed (−offset) from a nominal value (0). Different methods can be used to implement this feature of the memory. The clock signal frequency would be calibrated, described above, to establish a nominal clock frequency. The environmental parameters such as temperature and voltage are then measured. The measured values, either separately or in combination, are used to adjust the clock signal frequency. The measured parameter values can be used by an internal control circuit or by an external controller to determine the appropriate direction and magnitude of the clock signal frequency change. If the system is operating in an enhanced mode, the offsets illustrated in Table 5 would be used in place of Table 3. Again, Table 3 is used to maintain a constant operating speed over operating variables, while Table 5 is used to change operating speed to increase performance. While the memory is operating in this increased performance mode, operating errors are monitored. If a predetermined amount of errors are detected, the clock frequency is reset to operate at the nominal frequency while the environmental parameters are again measured to determine if a change has occurred. The clock frequency can then be readjusted based upon the newly measured parameter values.

Conclusion

An integrated circuit has been described which has circuitry to detect environmental conditions such as temperature and supply voltage and adjust the operation of the circuit accordingly. A flash memory device has been described which includes a temperature detector and a supply voltage detector. The memory monitors temperature and voltage and adjusts an oscillator circuit to maintain an ideal operating frequency. The oscillator includes adjustable delay stages which can be selectively fed back to adjust operating frequency. To save power, unused delay stages of the oscillator can be disabled. Oscillator calibration circuitry, a temperature detector, and a voltage detector are described. A method has been described for operating the memory at maximum performance levels by monitoring both environmental parameters and operating errors.

Although specific embodiments have been illustrated and described herein, it will be appreciated by those of ordinary skill in the art that any arrangement which is calculated to achieve the same purpose may be substituted for the specific embodiment shown. This application is intended to cover any adaptations or variations of the present invention. Therefore, it is manifestly intended that this invention be limited only by the claims and the equivalents thereof.

What is claimed is:

1. An integrated circuit comprising:
   an adjustable oscillator circuit for producing a clock signal that controls multiple functions of the integrated circuit;
   multiple sensors for detecting multiple dynamic parameters of the integrated circuit;
   a lookup table containing data representing a fast operable clock frequency for each combination of the multiple dynamic parameters of the flash memory circuit; and
   control circuitry for adjusting the adjustable oscillator circuit to produce the clock signal at the faste operable frequency based on the data loaded from the lookup table.

2. The integrated circuit of claim 1 further comprising:
   an internal detection circuit for measuring a dynamic parameter or parameters and outputting a multiple bit output signal.

3. The integrated circuit of claim 2 wherein at least one of the dynamic parameters is a temperature of the integrated circuit.

4. The integrated circuit of claim 2 wherein at least one of the dynamic parameters is a supply voltage level of the integrated circuit.

5. The integrated circuit of claim 2 wherein the lookup table further comprises:
   a data register containing data corresponding to possible states of the multiple bit output signal, the control circuitry adjusts the frequency of the clock signal based upon data retrieved from the data register.

6. The integrated circuit of claim 5 wherein the data in the data register is changed in response to a detected error in operation of the integrated circuit.

7. The integrated circuit of claim 1 wherein the adjustable oscillator circuit comprises:
   a ring oscillator having a plurality of cascaded delay stages; and
   controllable feedback circuitry for selectively coupling an output of one of the cascaded delay stages to an input of the ring oscillator.

8. The integrated circuit of claim 7 wherein the adjustable oscillator further comprises:

calibration circuitry for calibrating the ring oscillator to a nominal clock signal frequency.

9. The integrated circuit of claim 8 wherein the calibration circuitry comprises:
   a counter coupled to the ring oscillator for counting transitions of the clock signal; and
   a calibrate input coupled to the counter for receiving a calibrate pulse signal having a predetermined duration.

10. The integrated circuit of claim 7 wherein the adjustable oscillator further comprises:
    de-couple circuitry connected to the ring oscillator for disabling unused ones of the plurality of cascaded delay stages.

11. The integrated circuit of claim 1 further comprising:
    divider circuitry having divider stages coupled to the adjustable oscillator circuit for dividing the clock signal to produce an output signal having a frequency which is less than a frequency of the clock signal.

12. The integrated circuit of claim 11 wherein the divider circuitry further comprises:
    disable circuitry for disabling unused ones of the divider stages.

13. The integrated circuit of claim 1 wherein the integrated circuit is a memory device.

14. The integrated circuit of claim 1 further including disable circuitry to disable part of the adjustable oscillator to reduce power consumption.

15. The integrated circuit of claim 1 wherein the control circuitry adjusts the frequency of the clock signal when an error is detected in operating the integrated circuit.

16. A flash memory device comprising:
    an adjustable oscillator circuit for producing a clock signal that controls multiple functions of the flash memory device;
    internal circuitry for measuring multiple dynamic parameters of the memory device; and
    control circuitry for adjusting a frequency of the clock signal to a fast operable frequency in response to the measured dynamic parameters.

17. The flash memory device of claim 16 wherein the internal circuitry for measuring at least one of the dynamic parameters comprises a temperature detector for detecting a temperature of the flash memory.

18. The flash memory device of claim 17 wherein the temperature detector comprises:
    a reference circuit for providing a plurality of reference voltages;
    a temperature sensitive unit for producing a temperature sensitive voltage; and
    a plurality of differential circuits coupled to the temperature sensitive unit and the reference circuit, each of the differential circuits comparing one of the plurality of reference voltages with the temperature sensitive voltage for providing an output on a plurality of output lines.

19. The flash memory device of claim 18 wherein the temperature sensitive unit comprises a diode connected between the plurality of differential circuits and ground potential.

20. The flash memory device of claim 19 wherein the diode is fabricated as a transistor having a connected gate and drain.

21. The flash memory device of claim 17 wherein the temperature detector provides a multiple-bit output signal.

22. The flash memory device of claim 16 wherein the internal circuitry for measuring the multiple dynamic parameters comprises a voltage detector for detecting a supply voltage level of the flash memory.

23. The flash memory device of claim 22 wherein the voltage detector comprises:
    a voltage divider circuit coupled between the supply voltage and a lower voltage; and
    a plurality of differential circuits coupled to the voltage divider circuit and a reference voltage, each of the differential circuits comparing a voltage sampled from the voltage divider circuit with the reference voltage for providing an output on a plurality of output nodes.

24. The flash memory device of claim 23 wherein the voltage detector further comprises:
    reset circuitry for resetting the output on the output nodes to a predetermined level, and disabling the differential circuits.

25. The flash memory device of claim 24 wherein the reset circuitry further comprises:
    pull-up transistors connected to the output nodes, the pull-up transistors being activated by a reset signal; and
    disable circuitry connected to the plurality of differential circuits for disabling the plurality of differential circuits in response to the reset signal.

26. The flash memory device of claim 23 wherein the voltage detector provides a four bit output signal on the plurality of output nodes.

27. The flash memory device of claim 16 wherein the adjustable oscillator circuit comprises:
    a ring oscillator having a plurality of cascaded delay stages: and
    controllable feedback circuitry for selectively coupling an output of one of the cascaded delay stages to an input of the ring oscillator.

28. The flash memory device of claim 27 further comprising:
    a multiplex circuit connected to the ring oscillator for selectively coupling one of the plurality of cascaded delay stages to an input of the ring oscillator in response to multiplex circuit input signals.

29. The flash memory device of claim 28 further comprising:
    a small delay adjustment circuit located between the multiplex circuit and the input of the ring oscillator for further adjusting a frequency of the clock signal.

30. A flash memory device comprising:
    an adjustable ring oscillator having a plurality of cascaded delay stages for producing a clock signal;
    controllable feedback circuitry for selectively coupling an output of one of the cascaded delay stages to an input of the ring oscillator;
    internal circuitry for measuring a dynamic parameter of the memory device;
    control circuitry for adjusting a frequency of the clock signal in response to a measured dynamic parameter; and
    a register circuit coupled to the ring oscillator to disable unused ones of the plurality of cascaded delay stages.

31. The flash memory device of claim 16 further comprising:
    calibration circuitry for calibrating the adjustable oscillator circuit to a nominal clock signal frequency.

32. The flash memory device of claim 31 wherein the calibration circuitry comprises:
    a counter coupled to the adjustable oscillator circuit for counting transitions of the clock signal and providing an output; and a calibrate input coupled to the counter for receiving a calibrate pulse signal having a predetermined duration.

33. A flash memory device comprising:
an adjustable oscillator circuit for producing a clock signal;
internal circuitry for measuring a dynamic parameter of the memory device;
control circuitry for adjusting a frequency of the clock signal in response to a measured dynamic parameter;
calibration circuitry for calibrating the adjustable oscillator circuit to a nominal clock signal frequency;
a counter coupled to the adjustable oscillator circuit for counting transitions of the clock signal and providing an output;
a calibrate input coupled to the counter for receiving a calibrate pulse signal having a predetermined duration; and
a buffer coupled to the counter for gating an output count of the counter.

34. The flash memory device of claim 31 wherein the calibration circuitry further comprises:
an enable circuit coupled between the calibrate input and the counter for enabling the counter in response to either the calibrate pulse or a second input signal.

35. The flash memory device of claim 16 wherein the control circuitry adjusts the frequency of the clock signal to maintain a constant flash memory device operating speed.

36. The flash memory device of claim 16 wherein the control circuitry adjusts the frequency of the clock signal to optimize performance of the flash memory device.

37. The flash memory device of claim 16 further including disable circuitry to disable part of the adjustable oscillator to reduce power consumption.

38. The flash memory device of claim 16 wherein the control circuitry adjusts the frequency of the clock signal when an error is detected in operating the flash memory device.

39. A method of operating a memory circuit having an adjustable oscillator circuit for providing a clock signal, the method comprising:
calibrating the adjustable oscillator circuit to provide a clock signal that controls multiple functions and has a predetermined frequency;
detecting multiple dynamic parameters of the memory circuit; and
adjusting the adjustable oscillator in response to the detected dynamic parameters to change the frequency of the clock signal to a fast operable frequency.

40. The method of claim 39 wherein the oscillator comprises a cascaded series of delay stages, and the step of adjusting the oscillator comprises:
selectively coupling an output of one of the delay stages to an input of the oscillator through a feedback circuit.

41. The method of claim 40 further comprising disabling unused ones of the delay stages to save power consumption.

42. The method of claim 39 wherein detecting multiple dynamic parameters of the memory circuit further comprises detecting a temperature of the memory circuit.

43. The method of claim 42 wherein the step of detecting a temperature comprises:
providing a multiple bit output signal from a temperature detector circuit indicating a temperature range; and
providing a feedback control signal in response to the step of comparing for adjusting the adjustable oscillator.

44. The method of claim 43 further comprising comparing the multiple bit output signal with data stored in the memory circuit.

45. The method of claim 39 wherein detecting multiple dynamic parameters of the memory circuit further comprises detecting a supply voltage of the memory circuit.

46. The method of claim 45 wherein detecting a supply voltage comprises:
providing a multiple bit output signal from a supply voltage detector circuit indicating a supply voltage range; and
providing a feedback control signal in response to the step of comparing for adjusting the adjustable oscillator.

47. The method of claim 43 further comprising comparing the multiple bit output signal with data stored in the memory circuit.

48. The method of claim 39 wherein calibrating the adjustable oscillator circuit comprises:
counting transitions of the clock signal during a predetermined time period;
comparing the count of the transitions with data stored in the memory circuit; and
providing a feedback control signal in response to the step of comparing for adjusting the adjustable oscillator to provide the clock signal having a predetermined frequency.

49. A method of operating a memory circuit having an adjustable oscillator circuit for providing a clock signal, the method comprising;
calibrating the adjustable oscillator circuit to provide a clock signal having a predetermined frequency;
detecting a dynamic parameter of the memory circuit in response to a condition selected from the conditions comprising:
power is supplied to the memory;
the memory is placed in an idle state;
an error is detected in operation of the memory;
a predetermined number of program verify failures are detected in memory operation;
an erase failure is detected in memory operation;
a user command to check and adjust the dynamic parameter is received; and
a user command to load adjustment values is received; and
adjusting the adjustable oscillator in response to the detected dynamic parameter to change the frequency of the clock signal.

50. A method of operating a memory device comprising a clock circuit for providing a clock signal having a frequency, the memory device being designed to operate over an environmental parameter having lower, nominal, and upper levels, the method comprising the steps of:
adjusting the clock circuit so that the frequency of the clock signal is at a predetermined level when the environmental parameter is at the nominal level;
detecting a level of the environmental parameter;
adjusting the frequency of the clock signal based upon the detected level of the environmental parameter;
monitoring the operation of the memory device to detect operating errors;
resetting the clock circuit to the predetermined level if errors are detected;
detecting a new level of the environmental parameter after the clock circuit has been reset; and
adjusting the frequency of the clock signal based upon the detected new level of the environmental parameter.

51. A integrated circuit system comprising:
a plurality of integrated circuits, each of the integrated circuits comprising:
an adjustable oscillator circuit for producing a clock signal that controls multiple functions, and
an internal detection circuit for measuring a plurality of dynamic parameters and outputting an output signal; and
a controller coupled to the plurality of integrated circuits, the controller adapted to receive an output signal from the internal detection circuit of each of the plurality of integrated circuits, and provide a clock adjust signal to adjust a frequency of the clock signal of each of the adjustable oscillator circuits to a fast operable frequency in response to the output signals.

52. The integrated circuit system of claim 51 wherein the at least one of the plurality of dynamic parameters is temperature.

53. The integrated circuit system of claim 52 wherein the at least one of the plurality of dynamic parameters is a supply voltage level.

54. The integrated circuit system of claim 51 wherein the internal detection circuit measures both temperature and supply voltage.

55. The integrated circuit system of claim 51 wherein the controller calibrates the clock signal of the adjustable oscillator.

56. The integrated circuit system of claim 51 wherein the plurality of integrated circuits comprise flash memory devices.

57. The integrated circuit system of claim 51 wherein the controller comprises:
a data register containing data corresponding to possible states of the output signal, the controller providing the clock adjust signal based upon data retrieved from the data register.

58. A method of operating an integrated circuit, the method comprising the steps of:

monitoring environmental operating conditions;

reading a state of a data flag;

retrieving a clock setting corresponding to the monitored operating conditions from a first data table if the data flag is in a first state, and selecting a clock frequency so that the integrated circuit operated at its maximum performance under the monitored environmental operating conditions;

retrieving a clock oscillator setting corresponding to the monitored operating conditions from a second data table if the data flag is in a second state, and adjusting a clock oscillator so that the integrated circuit operates at a constant frequency under changes in the monitored environmental operating conditions.

59. A flash memory circuit comprising:

an adjustable oscillator circuit for producing a clock signal that controls multiple functions of the flash memory;

multiple sensors for detecting multiple dynamic parameters of the flash memory circuit;

a lookup table containing a delay offset factor for each combination of the multiple dynamic parameters of the flash memory circuit; and control circuitry for adjusting the adjustable oscillator circuit to to produce the clock signal at the constant frequency based on the delay offset factor loaded from the lookup table.

* * * * *

UNITED STATES PATENT AND TRADEMARK OFFICE
CERTIFICATE OF CORRECTION

PATENT NO.: 5,956,289

DATED: Sep. 21, 1999

INVENTOR(S): Norman et al.

It is certified that error appears in the above-identified patent and that said Letters Patent is hereby corrected as shown below:

In column 2, line 2, insert -- make -- after "to", therefor.

In column 9, line 51, insert a period after "Tref", therefor.

In column 23, line 15, delete "the" after "wherein", therefor.

In column 23, line 18, delete "the" after "wherein", therefor.

Signed and Sealed this

Twenty-seventh Day of June, 2000

Q. TODD DICKINSON

*Attest:*

*Attesting Officer*  *Director of Patents and Trademarks*